United States Patent
Smathers et al.

(10) Patent No.: US 7,638,200 B2
(45) Date of Patent: Dec. 29, 2009

(54) PROCESS FOR MAKING DENSE MIXED METAL $SI_3N_4$ TARGETS

(75) Inventors: David B. Smathers, Columbus, OH (US); Frank S. Valent, Galloway, OH (US); Michael J. Regan, Corvallis, OR (US)

(73) Assignees: Tosoh SMD, Inc., Grove City, OH (US); Hewlett-Packard Company, Corvalis, OR (US)

( * ) Notice: Subject to any disclaimer, the term of this patent is extended or adjusted under 35 U.S.C. 154(b) by 247 days.

(21) Appl. No.: 10/527,513

(22) PCT Filed: Aug. 27, 2003

(86) PCT No.: PCT/US03/27145

§ 371 (c)(1),
(2), (4) Date: Oct. 26, 2005

(87) PCT Pub. No.: WO2004/024452

PCT Pub. Date: Mar. 25, 2004

(65) Prior Publication Data

US 2006/0166010 A1  Jul. 27, 2006

Related U.S. Application Data

(60) Provisional application No. 60/410,607, filed on Sep. 13, 2002.

(51) Int. Cl.
- C04B 35/587 (2006.01)
- B28B 1/00 (2006.01)
- B32B 13/04 (2006.01)

(52) U.S. Cl. .................. 428/446; 501/97.2; 501/97.3; 264/683

(58) Field of Classification Search ................ 428/466; 501/97.2, 97.3; 264/683
See application file for complete search history.

(56) References Cited

U.S. PATENT DOCUMENTS

| | | | |
|---|---|---|---|
| 3,555,597 A | 1/1971 | Meadows | |
| 3,971,875 A | 7/1976 | Regalbuto | |
| 5,162,272 A | 11/1992 | Peuckert et al. | |
| 5,234,642 A | 8/1993 | Nishioka et al. | |
| 6,242,374 B1 * | 6/2001 | Komatsu | 501/97.2 |
| 6,544,917 B1 * | 4/2003 | Miyanaga et al. | 501/154 |
| 6,911,162 B2 * | 6/2005 | Yoshimura | 252/518.1 |

FOREIGN PATENT DOCUMENTS

| | | | |
|---|---|---|---|
| JP | 11139877 A | * | 5/1999 |
| WO | WO 99/03623 | | 1/1999 |

OTHER PUBLICATIONS

Machine translation of JP-11139877A (Yamakawa et al).*

* cited by examiner

*Primary Examiner*—Roy King
*Assistant Examiner*—Jie Yang
(74) *Attorney, Agent, or Firm*—Wegman, Hessler & Vanderburg

(57) ABSTRACT

A composition and method for fabricating high-density Ta—Al—O, Ta—Si—N, and W—Si—N sputtering targets, having particular usefulness for the sputtering of heater layers for ink jet printers. Compositions in accordance with the invention comprise a metal component, $Si_3N_4$, and a sintering aid so that the targets will successfully sputter without cracking, etc. The components are combined in powder form and pressure consolidated under heated conditions for a time sufficient to form a consolidated blend having an actual density of greater that about 95% of the theoretical density. The consolidated blend may then be machined so as to provide the final desired target shape.

5 Claims, 5 Drawing Sheets

PROCESS FOR MAKING DENSE MIXED METAL SI$_3$N$_4$ TARGETS

CROSS-REFERENCE TO RELATED APPLICATIONS

This application claims the priority filing benefit of International PCT Application PCT/US 2003/027145 filed Aug. 27, 2003, and published under PCT 21 (2) in the English language; and U.S. Provisional Patent Application Ser. No. 60/410,607 filed Sep. 13, 2002.

BACKGROUND OF THE INVENTION

In the sputtering of heater layers for ink jet printers, Ta—Al—O, Ta—Si—N, and W—Si—N targets are required. Such targets must have actual densities of greater than 95% theoretical and be available in a variety of target platform geometries.

Prior targets for the above sputtering application have been fabricated using VHP or HIPing with the resulting targets exhibiting unacceptable low densities.

Accordingly, there is a need to provide methods for forming the above and other targets that approach theoretical target densities so that they will successfully sputter without cracking, etc.

DESCRIPTION OF THE INVENTION

Compositions in accordance with the invention comprise a metal component, Si$_3$N$_4$, and a sintering aid. The metal is a member selected from the group consisting of Groups IVB, VB, VIB, and VIII of the Periodic Table. The metal is present in an amount of between 40-80 atomic percent, and the Si$_3$N$_4$ is present in an amount of about 60-20 atomic percent with the combined atomic percent of the metal and Si$_3$N$_4$ component being 100 atomic percent. The sintering aid is chosen from the groups of MgO and SiO. The sintering aid is present in the amount of between about 0.05-30 wt % based upon the weight of the Si$_3$N$_4$ component. More preferably, the metal is selected from the group consisting of W, Ta, Nb, Zr, Hf, Pt, Ir, Mo, and Ru. Preferably, the sintering aid is MgO and the desired metal is tungsten. When magnesium oxide is present as the sintering aid, preferred utilization amounts range from 0.5-6 wt % of the MgO based on the weight of the Si$_3$N$_4$. When SiO is used as the sintering aid, larger amounts must be used on the order of about 15-30 wt % of the SiO based on the weight of silicon nitride.

Preferably, the components are combined in powder form and pressure consolidated under heated conditions for a time sufficient to form a consolidated blend having an actual density of greater than about 95% of the theoretical density. The pressure-consolidated blend may then be machined so as to provide the final desired target shape.

At present, it is preferred to pressure consolidate utilizing a vacuum hot press operating at slightly more than one atmosphere of pressure as supplied via an inert gas such as argon. Utilization of the slight overpressure helps to prevent decomposition of the Si$_3$N$_4$ component of the target composition. Processes in accordance with the invention achieve greater than 95% theoretical density for the target with 97%-100% of input nitrogen content being maintained in the final target.

DRAWINGS

Turning to FIG. 1 of the drawings, there is shown a target assembly of the type that may be made in accordance with the invention. Here, target 2 is supported atop backing plate 6 in conventional manner. A thin layer of indium or other ductile solder 4, bonds the target to the backing plate. The backing plate may comprise a variety of metals such as copper.

Figure 1:
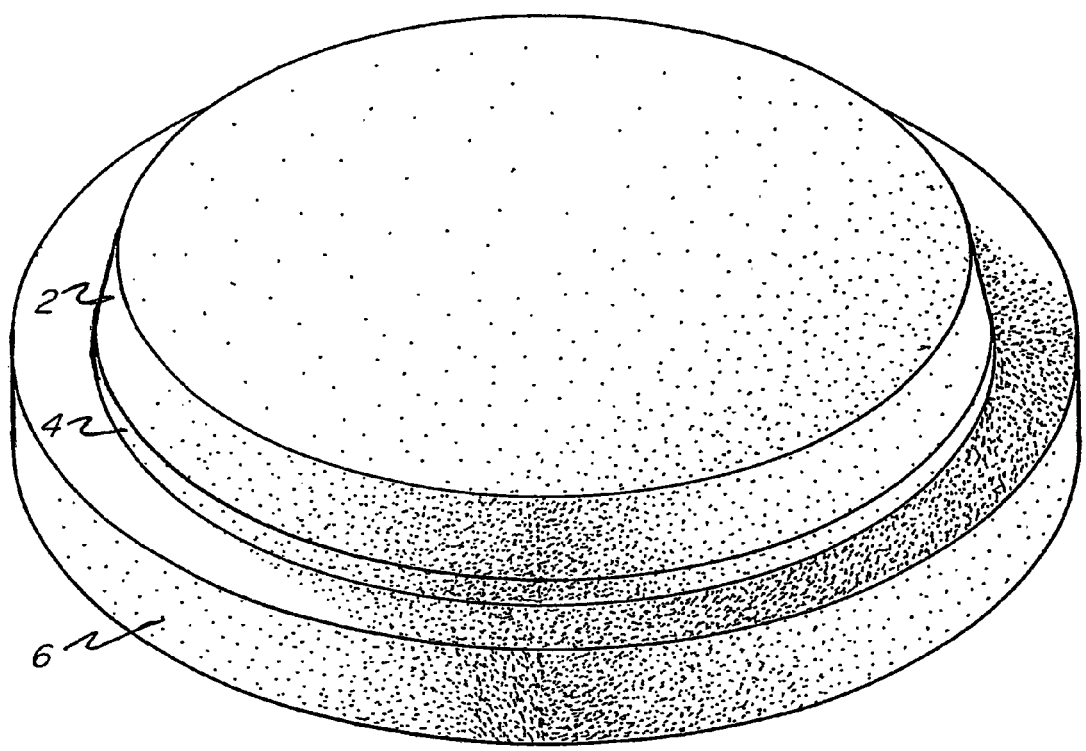
Figure 2:
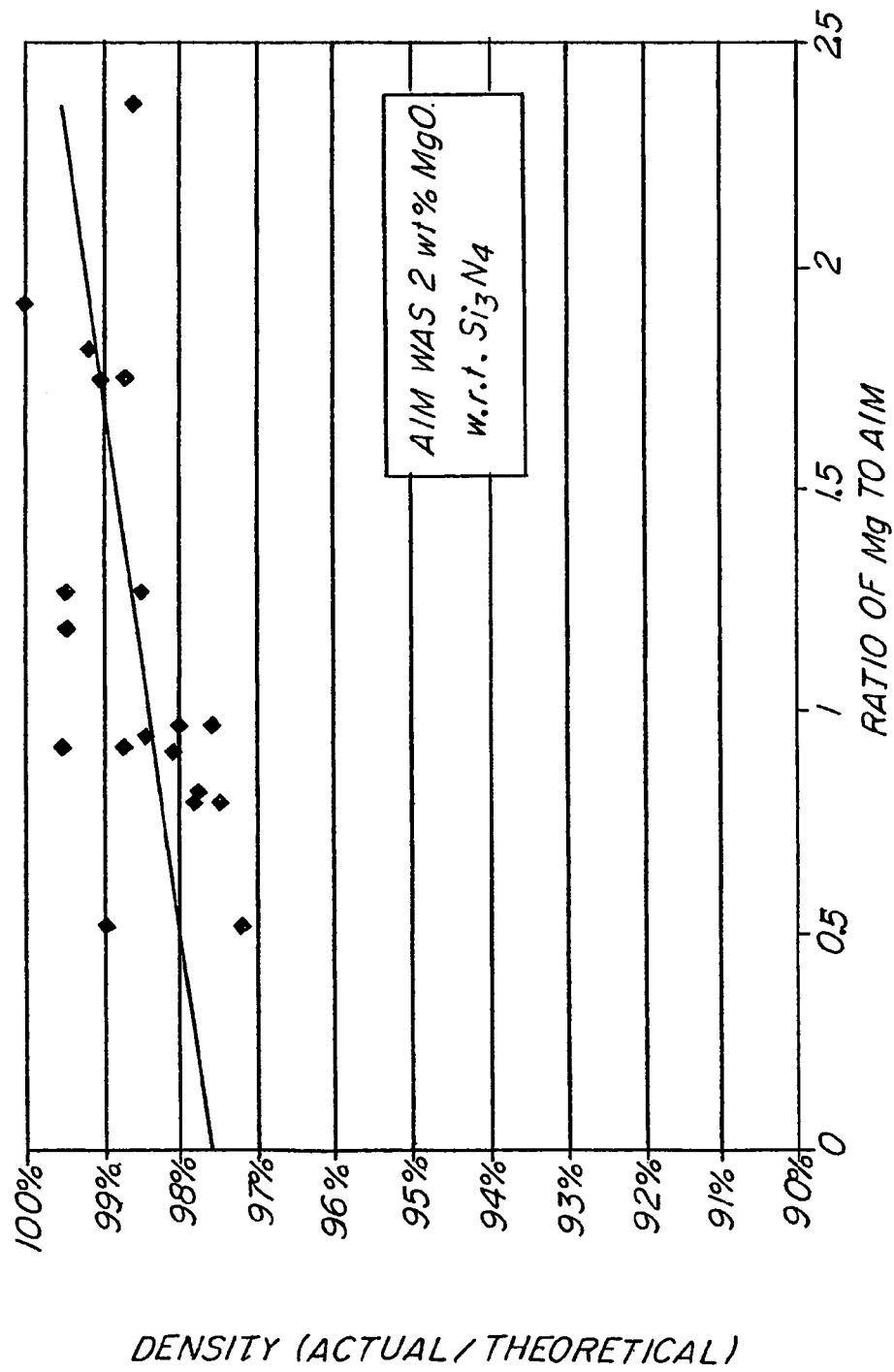
FIG. 2 illustrates that high density targets are provided utilizing MgO as the sintering aid. The X axis of the graph sets forth the ratio of Mg to aim point which aim point was 2 wt % based upon the weight of the Si$_3$N$_4$ component of the composition.
Figure 3:
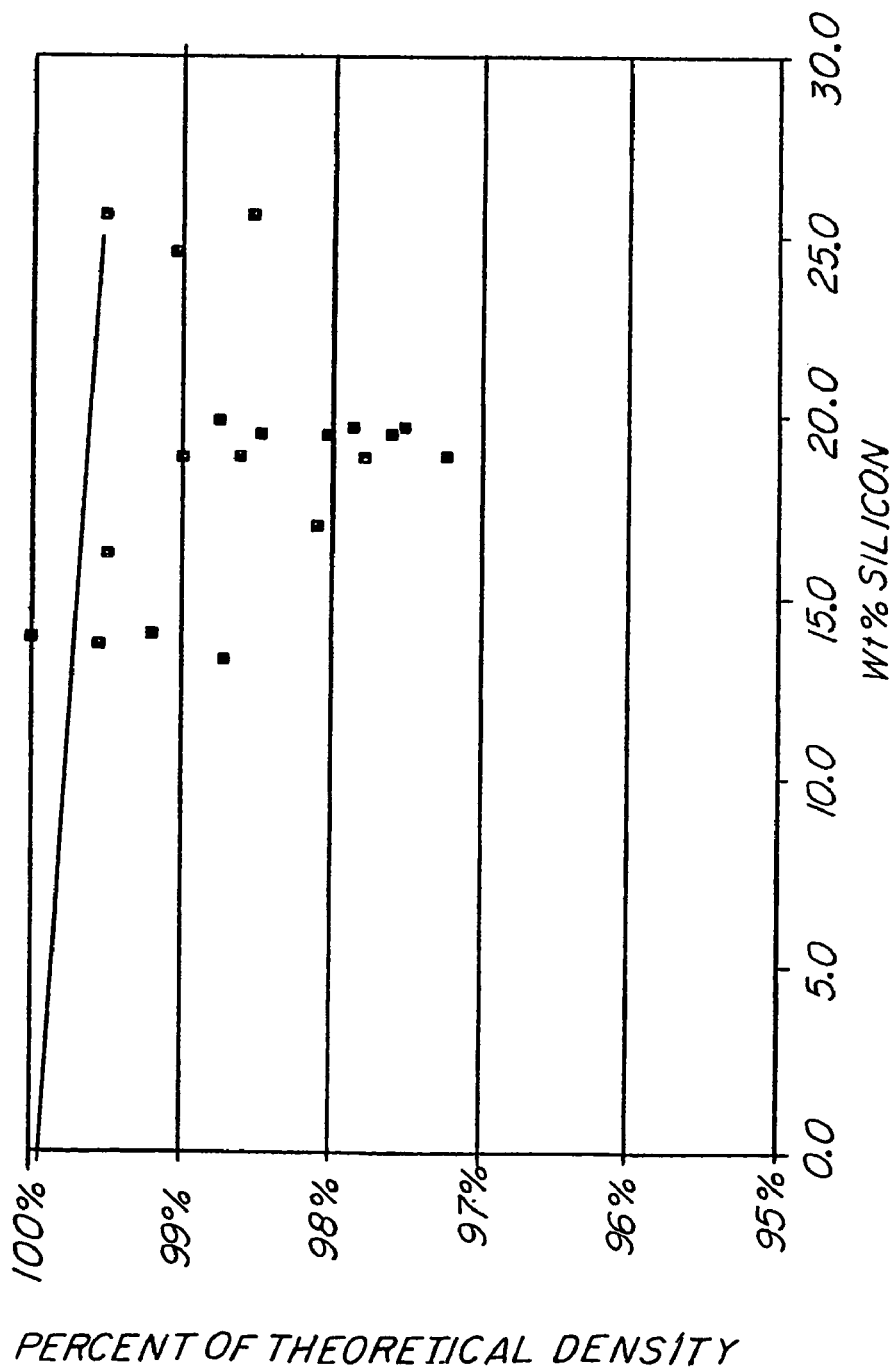
FIG. 3 illustrates that densities greater than 97% of theoretical can be a achieved for the different silicon contents.
Figure 4:
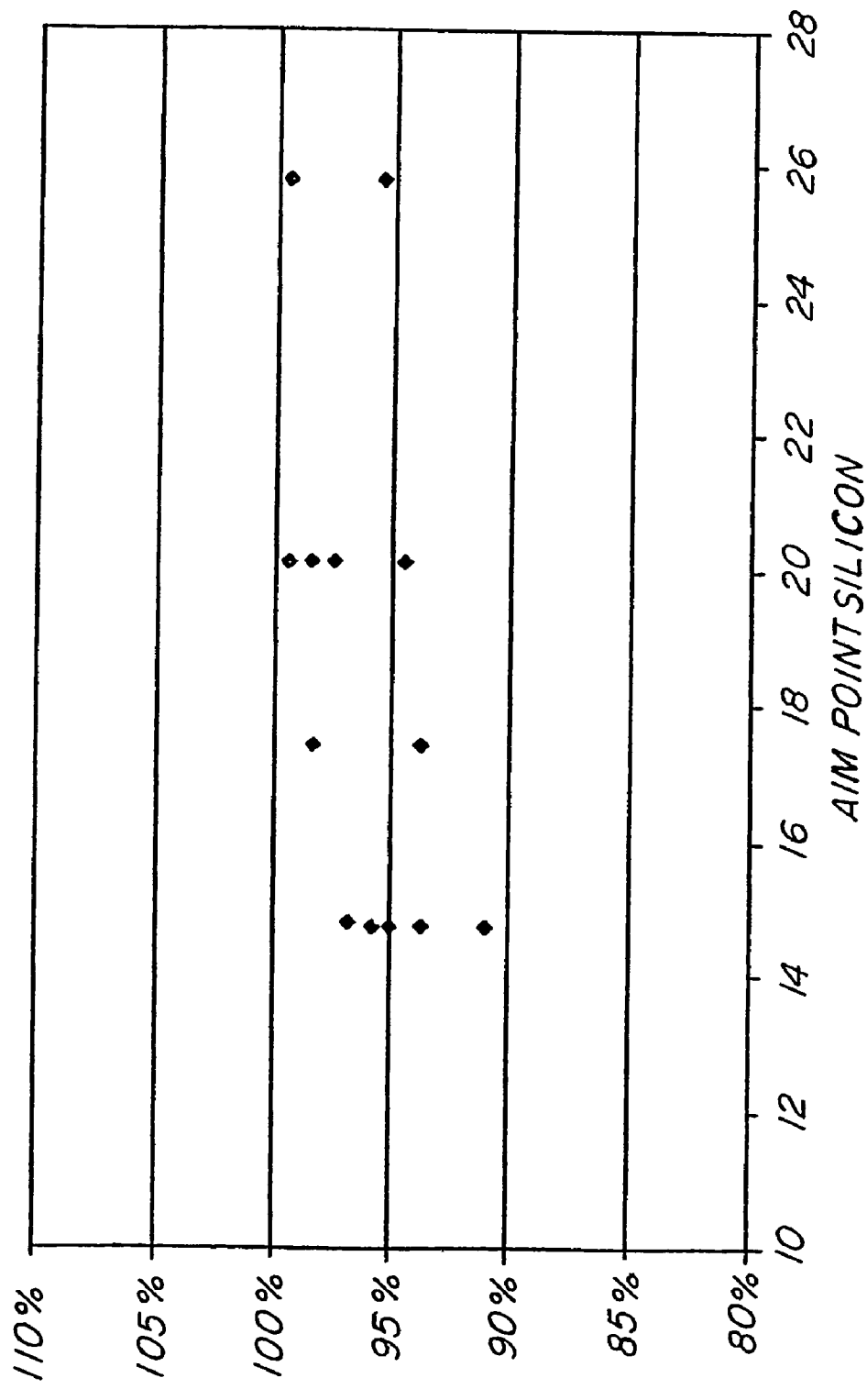
FIG. 4 shows that the desired amount of silicon in the final target composition is maintained at a ratio of greater than about 90% at various aim points for the silicon. Similar data is shown in FIG. 5 for nitrogen yield.
Figure 5:
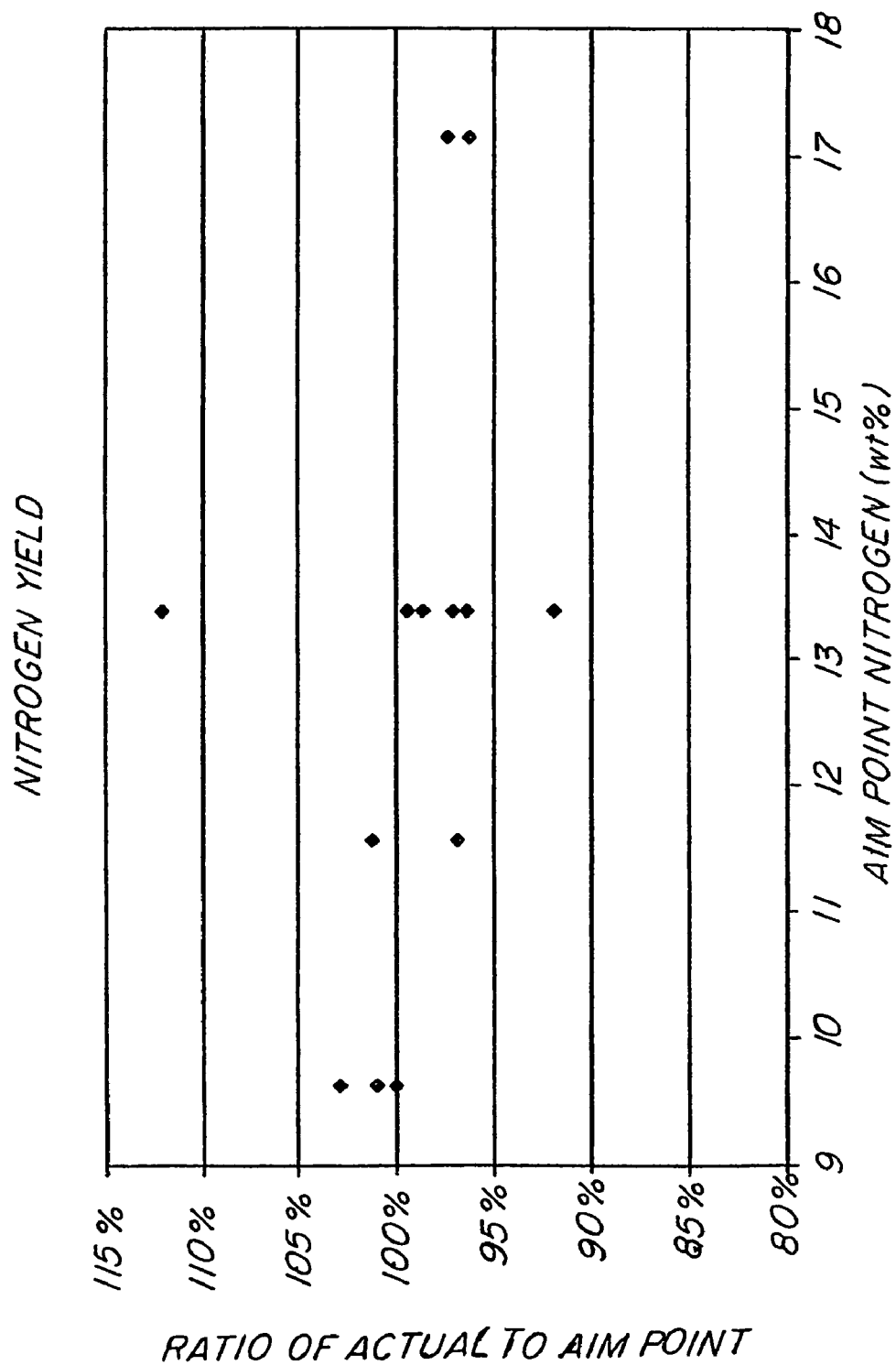

Preferably, the Si$_3$N$_4$ is mixed with the desired sintering aid in powder form with the desired metal powder then added. For example, Si$_3$N$_4$ may be first mixed with magnesium oxide with the mixture being −325 mesh. The Si$_3$N$_4$/MgO mixture is blended with the tungsten powder. The tungsten powder may be −200 mesh, but it may be made up of individual powder particles nominally from one to five microns in size. The mixture is screened through a −50 mesh screen multiple times (at least twice) to minimize the size of agglomerated Si$_3$N$_4$ to less than 300 microns in diameter. The MgO is hydroscopic and causes the mixture to absorb water and clump. The mixture is formed into a target blank using the vacuum hot press as shown in the following example. The press operates at 800 torr/1640° C. during the peak of the cycle. The target blank then may be ground to desired thickness and diameter and soldered to a backing plate such as Cu/Cr backing plate using indium solder.

It may be possible to screen the powder components under a protective atmosphere of nitrogen to limit moisture pickup. Additionally, a variety of different types of screening equipment designed to break up agglomerations such as a SWEECO vibrating head or other powder blending techniques such as mechanical alloying may be utilized to get better mixing of the different density components.

The sintering aid, preferably MgO, causes the Si$_3$N$_4$ to densify, and the target stays intact during sputtering. The vacuum hot press provides near net shaped parts so as to improve material utilization. The operation of the VBP at a slight overpressure (800 torr) keeps the nitrogen from escaping the mixture during high temperature press cycle.

EXAMPLES

A sputtering target made with 60 atomic percent Tungsten and 40 atomic percent Silicon Nitride (Si$_3$N$_4$) mixed with Magnesium Oxide (MgO) in a ratio of 2 wt % MgO with respect to the Si$_3$N$_4$ (58.38 at % W; 38.92 at % Si$_3$N$_4$; 2.7 at % MgO). This target may be made by either of the following exemplary processes.

Procedure A

A.1. Blending powders [metal powder with agglomerates smaller than 75 microns (−200 mesh—ideally the individual powder particles are smaller than 10 microns)] with a pre-mixed combination of Si$_3$N$_4$ and MgO (0.05 to 4 wt % w.r.t. Si$_3$N$_4$) [mixture with agglomerates smaller than 45 microns (minus 325 mesh—ideally the individual powder particles are nominally 1 micron)] in a V-Cone blender.

A.2. Screening the mixture through a minus 50 mesh screen (300 micron wide openings) using a vibrating screen with or without a protective atmosphere of nitrogen or argon.

Screening and Blending may be done in combination by other means designed to keep the $Si_3N_4$ agglomerates smaller than 300 microns in dimension.

A.3. Vacuum Capable Hot Press using Recipe A-VIP (operates at 800 torr at peak temperature).

A.4. Press for sufficient time and temperature to cause the Metal/$Si_3N_4$ to reach more than 95% theoretical density.

A.5. Removing target from Hot Press and grinding target to dimensions for sputtering.

A.6. Bonding (if needed) to backing plate using low melting temperature, ductile solder like Indium.

Recipe A-VHP (For 14" diameter Blank)
Ramp temperature to 900° C. under vacuum
Backfill Argon to 800 Torr
Ramp temperature to 1000° C. (hold)
Ramp temperature to 1400° C.
Ramp pressure to 77 tons (hold)
Ramp pressure to 304 tons [tonnage is determined by area] 3950 lbs/in² [27.2 MPa]
Ramp temperature to 1640° C., hold 120 minutes
Bleed pressure 30 Tons/minute to Zero
Turn off Heater; Cool in Chamber Procedure B B.1. Blending powders [metal powder with agglomerates smaller than 75 microns (−200 mesh—ideally the individual powder particles are smaller than 10 microns)] with a premixed combination of $Si_3N_4$ and MgO (0.05 to 4 wt % w.r.t. $Si_3N_4$) [mixture with agllomerates smaller than 45 microns (minus 325 mesh—ideally the individual powder particles are nominally 1 micron)] in a V-Cone blender.

B.2. Screening the mixture through a minus 50 mesh screen (300 micron wide openings) using a vibrating screen with our without a protective atmosphere of nitrogen or argon.

B.3. Pressing a green target shape.

B.4. Coating the green target shape with a glass coating.

B.5. Heating the coated part in a Hot Isostatic Press for 120 minutes at 1640° C. and 20-50 MPa.

B.6. Grinding the coating from the desified target and grinding the target to shape.

B.7. Bonding to appropriate backing plate using solder.

What is claimed is:

1. Method of making a sputter target for sputtering a heater layer of an ink jet printer comprising:
    (a) providing elemental W metal powder, $Si_3N_4$ powder and MgO;
    (b) blending said elemental W metal powder, $Si_3N_4$ powder and MgO to form an agglomerated blend, screening said agglomerated blend to result in an agglomerated blend of less than 300 microns in dimension; and
    (c) pressure consolidating said agglomerated blend of less than 300 microns under heated conditions for a time sufficient to form a consolidated blend having an actual density of greater than 95% of the theoretical density, said agglomerated blend comprising from about 40-about 80 atomic percent W, about 60- about 20 atomic percent $Si_3N_4$, with the atomic percent of said $Si_3N_4$ and W equaling about 100 atomic percent, said MgO being present in an amount of between about 0.05-6 weight percent based on the weight of said $Si_3N_4$.

2. Method as recited in claim 1 further comprising machining said pressure consolidated blend from said step (c) to final desired shape.

3. Method as recited in claim 1 further comprising conducting said pressure consolidating step (d) in an inert gaseous atmosphere.

4. Method as recited in claim 3 wherein said pressure is greater than about 1atmosphere.

5. Method as recited in claim 4 wherein pressure consolidation is conducted at temperatures of about 900° C.-1700° C.

* * * * *

UNITED STATES PATENT AND TRADEMARK OFFICE
CERTIFICATE OF CORRECTION

PATENT NO. : 7,638,200 B2  Page 1 of 1
APPLICATION NO. : 10/527513
DATED : December 29, 2009
INVENTOR(S) : Smathers et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 866 days.

Signed and Sealed this

Ninth Day of November, 2010

David J. Kappos
*Director of the United States Patent and Trademark Office*